United States Patent
Endo et al.

(10) Patent No.: US 11,181,573 B2
(45) Date of Patent: Nov. 23, 2021

(54) INSPECTION APPARATUS AND CLEANING METHOD OF INSPECTION APPARATUS

(71) Applicant: Tokyo Electron Limited, Tokyo (JP)

(72) Inventors: Tomoya Endo, Nirasaki (JP); Kentaro Konishi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 186 days.

(21) Appl. No.: 16/507,259

(22) Filed: Jul. 10, 2019

(65) Prior Publication Data
US 2020/0018791 A1  Jan. 16, 2020

(30) Foreign Application Priority Data

Jul. 12, 2018 (JP) .............................. JP2018-132663

(51) Int. Cl.
G01R 31/28 (2006.01)

(52) U.S. Cl.
CPC ..... *G01R 31/2868* (2013.01); *G01R 31/2831* (2013.01); *G01R 31/2862* (2013.01); *G01R 31/2867* (2013.01); *G01R 31/2877* (2013.01); *G01R 31/2891* (2013.01)

(58) Field of Classification Search
CPC ............ G01R 31/2831; G01R 31/2862; G01R 31/2867; G01R 31/2868; G01R 31/2874; G01R 31/2877; G01R 31/2881; G01R 31/2891; H01L 21/67103; H01L 21/67107
USPC .................. 324/750.08, 750.03, 750.01, 537
See application file for complete search history.

(56) References Cited

U.S. PATENT DOCUMENTS

| | | | | |
|---|---|---|---|---|
| 6,784,972 | B2 * | 8/2004 | Nagahashi | G03F 7/70858 355/30 |
| 7,416,574 | B2 * | 8/2008 | Udagawa | B01D 46/0001 219/400 |
| 10,818,004 | B2 * | 10/2020 | Iwanaga | G06T 7/0006 |
| 10,823,778 | B2 * | 11/2020 | Akiyama | G01R 31/2877 |
| 10,928,441 | B2 * | 2/2021 | Kanosue | G01R 31/2891 |

FOREIGN PATENT DOCUMENTS

| | | |
|---|---|---|
| JP | 2003-179109 A | 6/2003 |
| JP | 2017-168857 A | 9/2017 |
| KR | 10-2010-0036996 A | 4/2010 |

* cited by examiner

*Primary Examiner* — Giovanni Astacio-Oquendo
(74) *Attorney, Agent, or Firm* — Pearne & Gordon LLP

(57) ABSTRACT

An inspection apparatus configured to inspect a target object includes an inspector configured to perform an inspection of an electrical characteristic upon the target object; a gas flow source provided within the inspector and configured to generate a gas flow which cools an inside of the inspector; a position adjuster configured to place the target object thereon and perform a position adjustment between the placed target object and the inspector; a housing which accommodates the inspector and the position adjuster in a same space; and a circulation device configured to circulate a gas by the gas flow source between the inside of the inspector and a region where the position adjuster is located within the space, the circulation device including a cooler configured to cool the gas being circulated and a foreign substance remover configured to remove a foreign substance from the gas being circulated.

16 Claims, 5 Drawing Sheets

INSPECTION APPARATUS AND CLEANING METHOD OF INSPECTION APPARATUS

CROSS-REFERENCE TO RELATED APPLICATION

This application claims the benefit of Japanese Patent Application No. 2018-132663 filed on Jul. 12, 2018, the entire disclosures of which are incorporated herein by reference.

TECHNICAL FIELD

The various aspects and embodiments described herein pertain generally to an inspection apparatus and a cleaning method of the inspection apparatus.

BACKGROUND

Patent Document 1 describes a probe apparatus configured as a separate body from a test head for electrical characteristic inspection. This probe apparatus includes an inspection chamber in which a main chuck configured to place a target object thereon and an alignment mechanism for the target object placed on this main chuck are accommodated. Further, in this probe apparatus, a circulation duct configured to circulate air within the inspection chamber is connected to the corresponding inspection chamber, and a FFU (Fan Filter Unit) is provided near an outlet of the circulation duct.
Patent Document 1: Japanese Patent Laid-open Publication No. 2003-179109

SUMMARY

In one exemplary embodiment, an inspection apparatus configured to inspect a target object includes an inspector configured to perform an inspection of an electrical characteristic upon the target object; a gas flow source provided within the inspector and configured to generate a gas flow which cools an inside of the inspector; a position adjuster configured to place the target object thereon and perform a position adjustment between the placed target object and the inspector; a housing which accommodates the inspector and the position adjuster in a same space; and a circulation device configured to circulate a gas by the gas flow source between the inside of the inspector and a region where the position adjuster is located within the space, the circulation device including a cooler configured to cool the gas being circulated and a foreign substance remover configured to remove a foreign substance from the gas being circulated.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
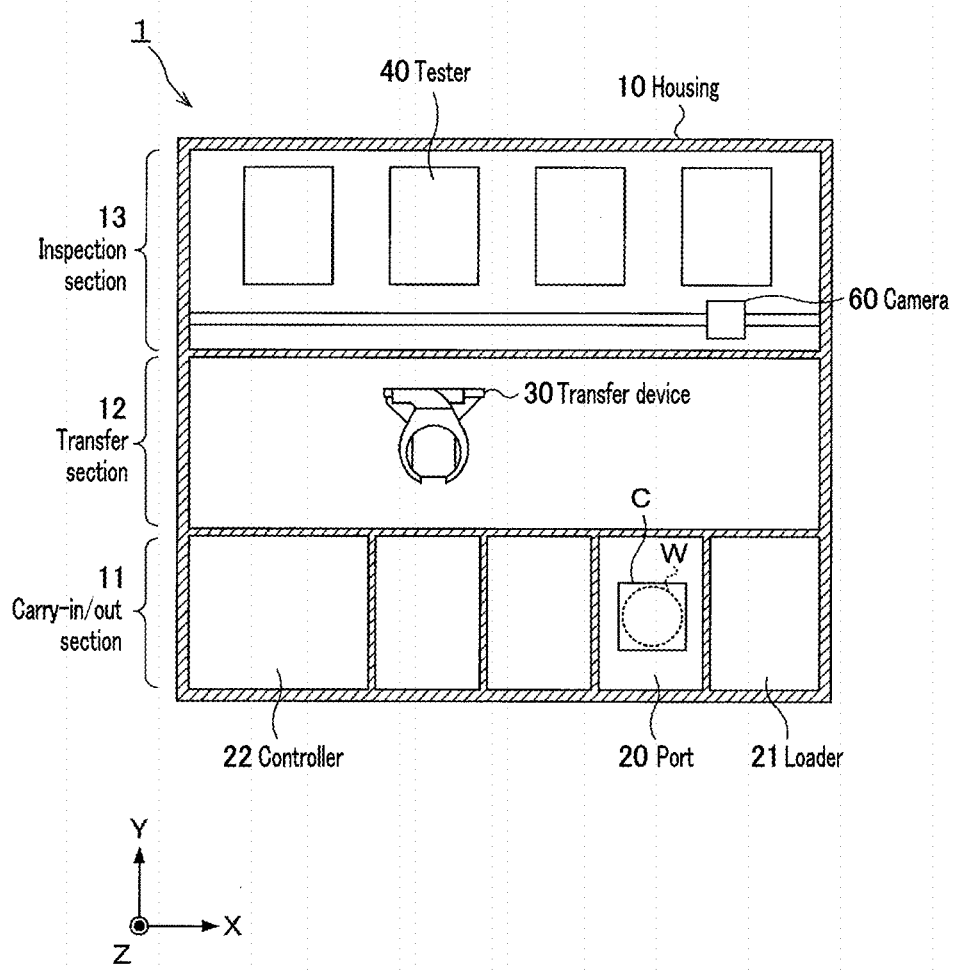
FIG. 1 is a transversal cross sectional view illustrating a schematic configuration of an inspection apparatus according to a first exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Conventionally, by providing a FFU at a place such as a clean room or an inside of a semiconductor manufacturing apparatus where cleanness is required, the internal environment is cleaned.

In the probe apparatus disclosed in Patent Document 1, the circulation duct equipped with the FFU is connected to the inspection chamber in which the main chuck configured to place a target object thereon and the alignment mechanism are accommodated, and air within the inspection chamber is circulated through the circulation duct (see "Background" of Patent Document 1). In this configuration, by removing a particle mixed in the air being circulated, a degree of cleanness (i.e., cleanness level) is improved.

If, however, the circulation duct having the FFU is provided in the inspection chamber as in the probe apparatus described in the aforementioned Patent Document 1, a footprint of the apparatus is increased, resulting in a scale-up of the apparatus.

The present disclosure aims at allowing the cleanness to be improved without scaling up an inspection apparatus. Hereinafter, an inspection apparatus and a cleaning method of the inspection apparatus according to exemplary embodiments will be described with reference to the accompanying drawings. In the specification and the drawings, parts having substantially same functional parts will be assigned same reference numerals, and redundant description will be omitted.

First Exemplary Embodiment

Figure 2:
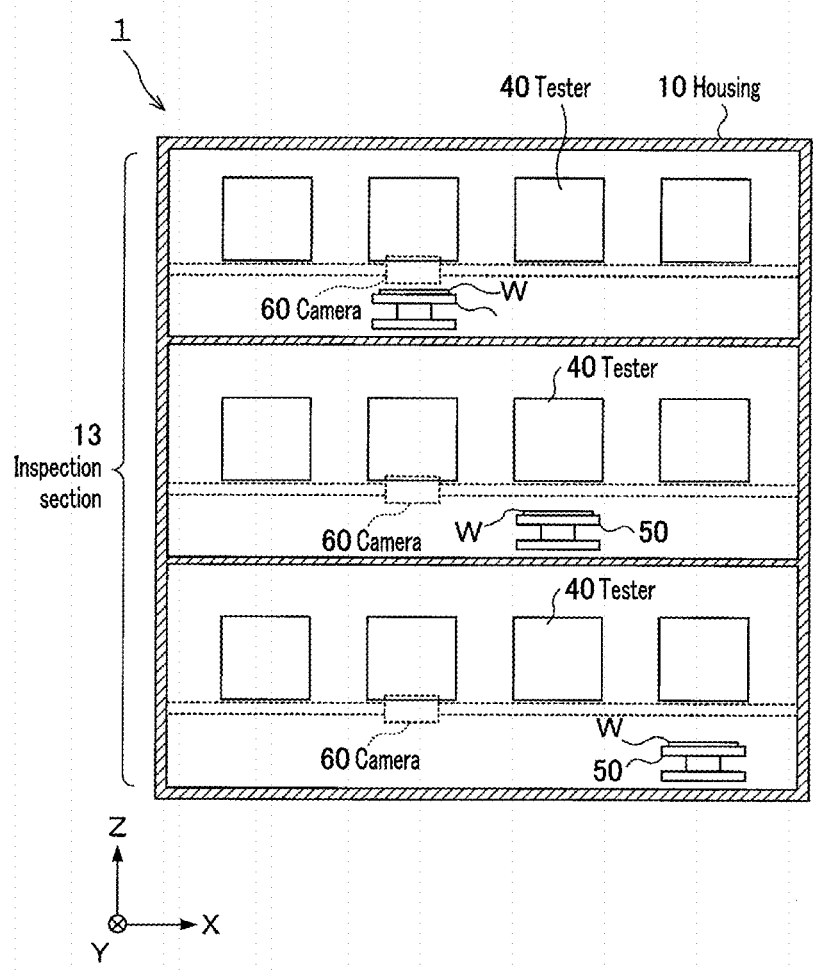
FIG. 2 is a longitudinal front cross sectional view illustrating the schematic configuration of the inspection apparatus according to the first exemplary embodiment.

FIG. 1 and FIG. 2 are a transversal cross sectional view and a longitudinal front cross sectional view, respectively, illustrating a schematic configuration of an inspection apparatus according to the first exemplary embodiment.

As depicted in FIG. 1 and FIG. 2, an inspection apparatus 1 has a housing 10, and the housing 10 has a carry-in/out section 11, a transfer section 12 and an inspection section 13. The carry-in/out section 11 is a region where a semiconductor wafer (hereinafter, simply referred to as "wafer") W as a target object is carried into/from the inspection apparatus 1. The transfer section 12 connects the carry-in/out section 11 and the inspection section 13. The inspection section 13 is a region where an inspection of an electrical characteristic of a semiconductor device formed on the wafer W is performed.

The carry-in/out section 11 is equipped with: a port 20 configured to receive a cassette C accommodating a multiple number of wafers W therein; a loader 21 configured to accommodate a probe card to be described later therein; and a controller 22 configured to control individual constituent components of the inspection apparatus 1.

Provided in the transfer section 12 is a transfer device 30 configured to be freely movable while holding the wafer W or the like. This transfer device 30 transfers the wafer W between the cassette C within the port 20 of the carry-in/out section 11 and the inspection section 13. Further, the transfer device 30 transfers a probe card which needs maintenance to the loader 21 of the carry-in/out section 11 from a tester to be described later within the inspection section 13, and transfers a new probe card or the probe card after being subjected to the maintenance from the loader 21 into the tester within the inspection section 13.

The inspection section 13 is equipped with a plurality of testers 40 as inspectors. To elaborate, as shown in FIG. 2, in the inspection section 13, three rows each having four testers 40, which are arranged in a horizontal direction (X direction of the drawing), are arranged in a vertical direction (Z direction of the drawing). In the inspection section 13, a single position adjuster 50 and a single camera 60 are provided for each of the rows of the testers. The position adjuster 50 is configured to place the wafer W thereon and performs a position adjustment between the wafer W placed thereon and the testers 40. The position adjuster 50 is provided under the testers 40. The camera 60 is configured to be movable horizontally along the corresponding row of the testers and is placed in front of each of the corresponding testers 40 constituting the corresponding row to image a positional relationship between the wafer W placed on the position adjuster 50 and the tester 40. Further, the number or the layout of the tester 40, the position adjuster 50 and the camera 60 may be selected as required.

In this inspection apparatus 1, while the transfer device 30 is transferring the wafer W toward one tester 40, another tester 40 can perform the electrical characteristic inspection of the semiconductor device formed on another wafer W.

Figure 3:
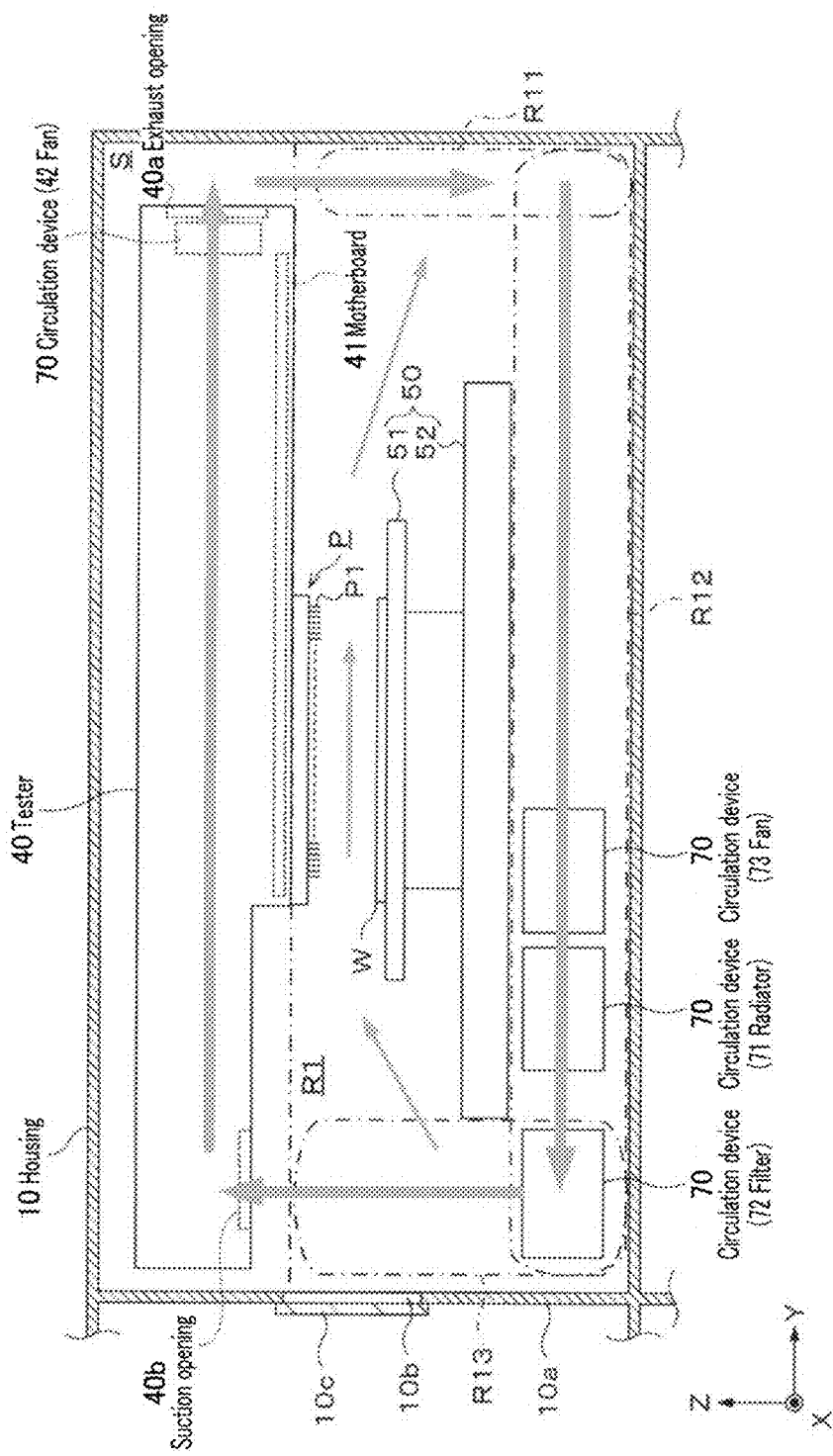
FIG. 3 is a longitudinal side cross sectional view showing an enlargement of the schematic configuration of the inspection apparatus according to the first exemplary embodiment.

FIG. 3 is a longitudinal side cross sectional view schematically illustrating an internal configuration of the inspection section 13. Thick grey arrows in the drawing indicate a main flow of air within an inspection space S to be described later, and thin grey arrows indicate a flow of air branched from the main flow.

The tester 40 is configured to perform the electrical characteristic inspection upon the wafer W, and a probe card P is disposed under the tester 40. The probe card P has a multiple number of probes P1 as contact terminals configured to be brought into electrical contact with electrodes of electronic devices formed on the wafer W. When inspecting the electrical characteristics of the electronic devices, the tester 40 sends and receives electric signals to/from the probes P1.

Further, the tester 40 incorporates therein a motherboard 41 which is configured to be in an electrical contact with the probes P1 via non-illustrated pogo pins. The motherboard 41 includes non-illustrated multiple inspection circuit boards which are arranged in a standing position. Further, a non-illustrated water cooler configured to cool the motherboard 41 and the inspection circuit boards is also provided within the tester 40.

Further, the tester 40 has an exhaust opening 40a at one end thereof and a suction opening 40b at the other end thereof to further cool the motherboard 41 and the inspection circuit boards by air. The tester 40 is equipped with a fan 42 as an airflow source configured to generate an airflow which is introduced into the tester 40 through the suction opening 40b from an outside of the tester 40 and exhausted from the inside of the tester 40 to the outside through the exhaust opening 40a. In the present exemplary embodiment, the fan 42 serves as an exhaust fan and is provided near the exhaust opening 40a.

The position adjuster 50 is equipped with a chuck top 51 configured to place the wafer W and attract the wafer W held thereon. The chuck top 51 incorporates therein a non-illustrated temperature control mechanism. Further, the position adjuster 50 is also equipped with an aligner 52 configured to support the chuck top 51 and move the chuck top 51 in an up-and-down direction (Z direction of the drawing), a back-and-forth direction (Y direction of the drawing) and a left-and-right direction (X direction of the drawing).

In the present exemplary embodiment, the tester 40 is accommodated in the inspection space S in which the position adjuster 50 is also accommodated. That is, the tester 40 and the position adjuster 50 are accommodated in the same space within the housing 10.

Furthermore, in the present exemplary embodiment, a circulation device 70 is provided in the inspection space S of the inspection section 13.

The circulation device 70 is configured to circulate a gas (air in the present exemplary embodiment) between the inside of the tester 40 and a region R1 where the position adjuster 50 is located in the inspection space S by using at least the fan 42. Further, the circulation device 70 has a radiator 71 as a cooler and a filter 72 as a foreign substance remover for the air being circulated.

Besides the aforementioned fan 42, the circulation device 70 of the present exemplary embodiment further includes a fan 73 as another airflow source in the region R1. In the present exemplary embodiment, the fan 73 serves as a suction fan.

The fan 42 and the fan 73 are disposed to allow the air within the tester 40 to be exhausted from the one end (where the exhaust opening 40a is provided) of the tester 40, to pass through regions (A) to (C) to be specified below, for example, in this sequence and to be sucked in from the other end (where the suction opening 40b is provided) of the tester 40 to be thereby circulated.

(A) First region R11: a region near the one end of the tester 40 at a lateral outside of the position adjuster 50

(B) Second region R12: a region under the position adjuster 50

(C) Third region R13: a region opposite from the first region R11 with the position adjuster 50 therebetween To elaborate, the fan 42 as the exhaust fan is disposed within the tester 40 to allow the air to flow in the horizontal direction (Y direction of the drawing) toward the lateral outside of the tester 40 (positive Y direction of the drawing) from the exhaust opening 40a. Further, the fan 73 as the suction fan is disposed in the second region R12 to allow the air to flow in the horizontal direction (Y direction of the drawing) from the first region R11 toward the third region R13.

Further, the radiator 71 is disposed in the second region R12 to cool the air circulated by the circulation device 70 (hereinafter, referred to as "circulation air"). The circulation air has a higher temperature at the moment when it is exhausted from the tester 40, as compared to when it is sucked into the tester 40. In the present exemplary embodiment, however, it can be cooled by the radiator 71. Accordingly, the motherboard 41 or the like within the tester 40 can be cooled by the circulation air as well. Further, in the shown example, the radiator 71 is located closer to the suction opening 40b of the tester 40 than the fan 73 is. However, the radiator 71 may be located closer to the exhaust opening 40a instead.

The filter 72 is provided at a boundary between the second region R12 and the third region R13. That is, the filter 72 is disposed at an end portion of the second region R12 near the third region R13 or at an end portion of the third region R13 near the second region R12.

An opening 10b for carry-in/out of the wafer W is provided at a sidewall 10a of the housing 10 as a partition wall on the side of the transfer section 12 which partitions the inspection space S in which both the tester 40 and the position adjuster 50 are accommodated. Further, a shutter 10c configured to open or close the opening 10b is provided at the opening 10b.

Now, an example of an inspection processing performed on the wafer W by using the inspection apparatus 1 will be discussed.

First, the wafer W is taken out from the cassette C within the port 20 of the carry-in/out section 11 by the transfer device 30 and is introduced into the inspection section 13 through the opening 10b. Then, the wafer W is placed on the chuck top 51 of the position adjuster 50. Thereafter, a position adjustment between the wafer W on the chuck top 51 and the probe card P in the horizontal direction is carried out by the aligner 52. Then, the chuck top 51 is moved up by the aligner 52, so that electrodes of an electronic device of the wafer W as the inspection target is brought into contact with the probes P1.

Then, the electrical signal for the inspection is inputted to the probes P1 from the tester 40, so the inspection of the electronic device is begun. After the inspection of one electronic device is completed, the position of the wafer W is adjusted by the aligner 52, and electrodes of another electronic device come into contact with the probes P1, so that the inspection upon this another electronic device is begun.

Then, these operations are repeated until the inspection upon all the electronic devices formed on the wafer W is completed. Upon the completion of the inspection of all the electronic devices, the wafer W is returned back into the cassette C within the port 20.

When the above-described inspection is performed, the air is circulated by the fan 42 and the fan 73 between the inside of the tester 40 and the region R1 where the position adjuster 50 is located in the inspection space S of the inspection apparatus 1. Concurrently, the circulation air is cooled by the radiator 71, and the foreign substance is removed from the circulation air by the filter 72.

Accordingly, the motherboard 41 and the above-stated inspection circuit boards within the tester 40, which suffer a temperature rise during the inspection, can be cooled by the circulation air. Further, the cleanness of the inspection section 13 of the inspection apparatus 1 can be maintained or increased during the inspection.

In cleaning the inspection apparatus 1 when the inspection apparatus 1 is operated or when the maintenance is completed, the air is circulated by the fan 42 and the fan 73 between the inside of the tester 40 and the region R1 where the position adjuster 50 is located in the inspection space S. Since the foreign substance is removed from the circulation air through the filter 72, the foreign substance that has existed within the inspection space S before the beginning of the cleaning operation is gradually decreased. By performing the above-described circulation of the air for a preset time period or longer, the degree of cleanness of the inspection space S of the inspection apparatus 1 can be set to a required level.

According to the present exemplary embodiment, the tester 40 and the position adjuster 50 are accommodated in the same inspection space S. Accordingly, the air can be circulated between the inside of the tester 40 and the region R1 where the position adjuster 50 is located in the inspection space S by the fan 42 which is disposed within the tester 40 and configured to generate the airflow which cools the inside of the tester 40. Since the foreign substance is removed from this circulation air by the filter 72, the cleanness of the inspection space S of the inspection apparatus 1 can be improved. Further, since the air is circulated between the inside of the tester 40 and the region R1 where the position adjuster 50 is located in the inspection space S as stated above, the circulation duct having the FFU need not be provided at the outside of the inspection space in which the position adjuster is accommodated, unlike in the conventional cases. Accordingly, the apparatus is not scaled up. Especially, in case that a plurality of position adjusters is provided, if the circulation duct having the FFU is installed for each of the position adjusters, a wide installation space is required. In the present exemplary embodiment, however, the wide installation space is not required. Furthermore, in the present exemplary embodiment, since the radiator 71 configured to cool the circulation air is provided, the inside of the tester 40 can be cooled by this circulation air.

If the tester and the position adjuster are accommodated in difference spaces unlike in the present exemplary embodiment, a partition wall which separates the inspection space and another space for accommodating therein the tester is required to have airtightness in order to obtain the degree of cleanness of the inspection space in which the position adjuster is provided. However, it is difficult to satisfy the airtightness of this partition wall while achieving a function (for example, a probe card replacement function) required for the inspection apparatus 1. To obtain the airtightness of the partition wall while securing the probe card replacement function or the like, for example, the number of components constituting the partition wall is increased. Thus, a structure of the partition wall is complicated, and a leakage may occur between the components. In contrast, in the configuration according to the present exemplary embodiment, the partition wall need not be provided between the tester 40 and the position adjuster 50, and it is only an outer wall constituting the housing 10 and a partition wall separating the inspection space S and another inspection space S that are required to have the airtightness in the inspection apparatus 1. Since the outer wall forming the housing 10 does not need to have a function accompanying a complicated structure, the higher airtightness is obtained. The partition wall which constitutes the housing and separates the inspection space S and another inspection space S can be omitted. Even if this partition wall is provided, this partition wall is not required to perform the function accompanying the complicated structure, the same as the outer wall. Thus, the higher airtightness can be obtained for this partition wall as well. Accordingly, unclean air cannot enter the inspection space S from the outside, so that the cleanness of the inspection space S of the inspection apparatus 1 can be easily improved.

Further, in the present exemplary embodiment, the circulation device 70 is configured as follows. That is, the circulation device 70 is configured such that the air within the tester 40 is mainly exhausted from the one end of the tester 40 near the exhaust opening 40a, passes through the first region R11, the second region R12 and the third region R13 in this sequence, for example, and is sucked into the tester 40 through the other end of the tester 40 near the suction opening 40b. That is, the air exhausted from the tester 40 is not directly supplied to the wafer W. Thus, even if the air exhausted from the tester 40 contains the foreign substance, this foreign substance does not affect the inspection.

Further, in the inspection apparatus 1, a part which is highly likely to generate the foreign particle is the position adjuster 50, more particularly, the aligner 52. That is, the air having passed through the aforementioned second region R12 is highly likely to contain the foreign substance. Further, after passing through the second region R12, the circulation air mainly passes through the third region R13 and reaches the suction opening 40b of the tester 40 as stated above. Some of the air having passed through the second region R12 may be branched from the main airflow reaching the tester 40 after passing through the third region R13 and may pass through a space above the wafer W or the vicinity thereof. Meanwhile, according to the present exemplary embodiment, the filter 72 is provided at the boundary between the second region R12 and the third region R13, that is, provided in a region upstream of the wafer W for the airflow branched from the main airflow toward the wafer W. Thus, even if the foreign particle is generated from the aligner 52 and the air passing through the second region R12 contains this foreign substance, the air passing through the space above the wafer W or in the vicinity thereof can be made to be free of the foreign substance.

Second Exemplary Embodiment

Figure 4:
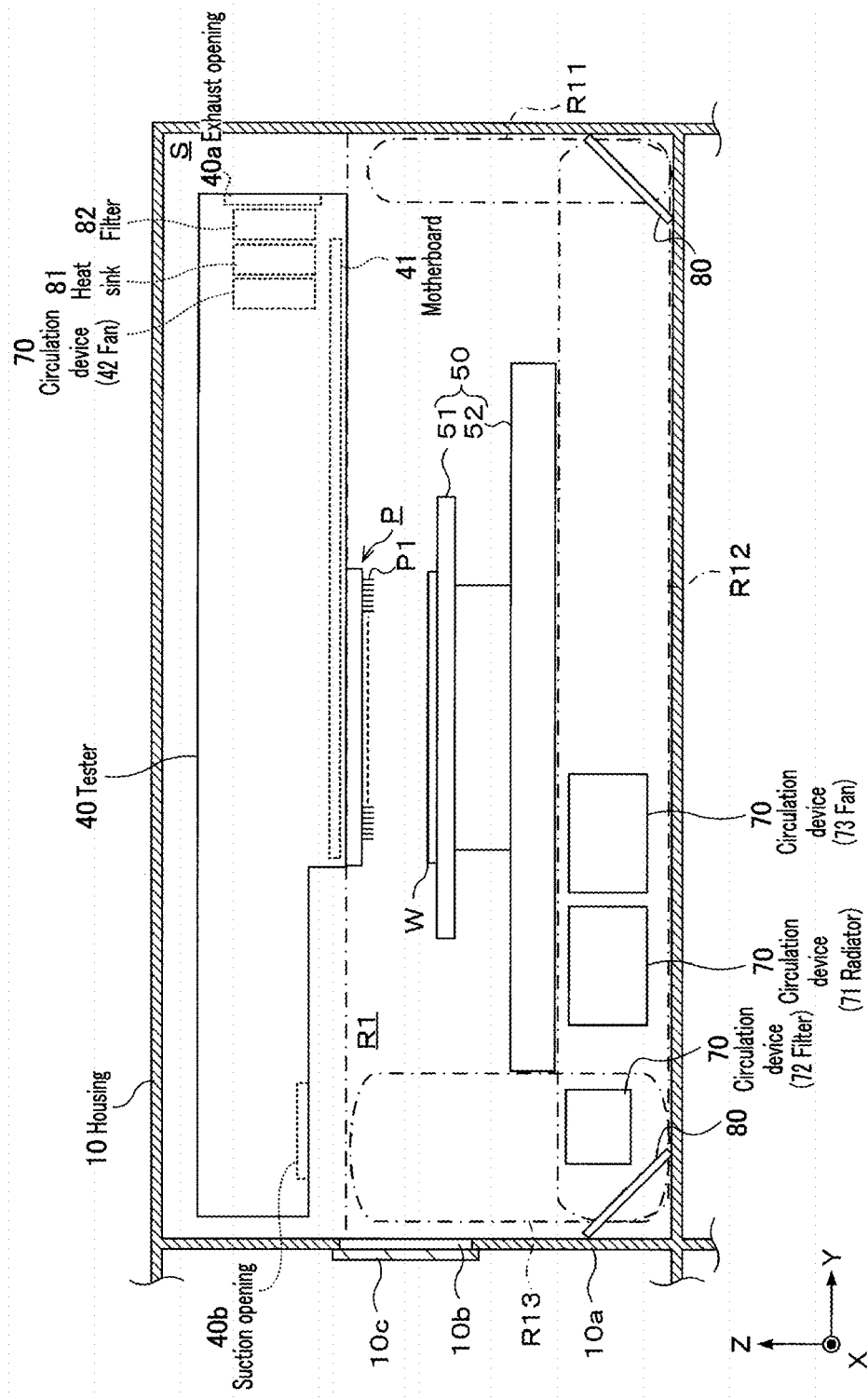
FIG. 4 is a longitudinal side cross sectional view showing an enlargement of a schematic configuration of an inspection apparatus according to a second exemplary embodiment.

FIG. 4 is a longitudinal side cross sectional view schematically illustrating an enlargement of a schematic configuration of an inspection apparatus according to a second exemplary embodiment.

An inspection apparatus 1 according to the second exemplary embodiment includes rectifying plates 80 in addition to the components of the inspection apparatus 1 of the first exemplary embodiment. The rectifying plates 80 are disposed at corners of the inspection space S in which the tester 40 and the position adjuster 50 are accommodated. Accordingly, the air exhausted from the one end (near the exhaust opening 40a) of the tester 40 does not stay at the corners of the inspection space S and is smoothly sucked through the other end (near the suction opening 40b) of the tester 40 after passing through the aforementioned regions (A) to (C) in this sequence, for example. Further, as illustrated in the drawing, though the rectifying plates 80 are provided at only the lower two of the four corners of the inspection space S, the locations of the rectifying plates 80 are not limited thereto. By way of example, the rectifying plates 80 may be provided at all of the four corners of the inspection space S.

Further, in the inspection apparatus 1 according to the present exemplary embodiment, a heat sink 81 configured to cool the air exhausted from the tester 40 by water is provided within the tester 40 to be located near the exhaust opening 40a. This heat sink 81 suppresses the inspection space S from being heated to a high temperature due to the air exhausted from the tester 40. Besides the water, various other types of cooling medium may be used in the heat sink 81.

Furthermore, in the inspection apparatus 1 of the present exemplary embodiment, a filter 82 configured to remove the foreign substance from the air exhausted from the tester 40 is provided near the exhaust opening 40a within the tester 40. Accordingly, the tester 40 is allowed to function as the FFU. Further, when the foreign particle is generated within the tester 40, this filter 82 can suppress deterioration of the cleanness of the inspection space S that might be caused by the circulation air.

Third Exemplary Embodiment

Figure 5:
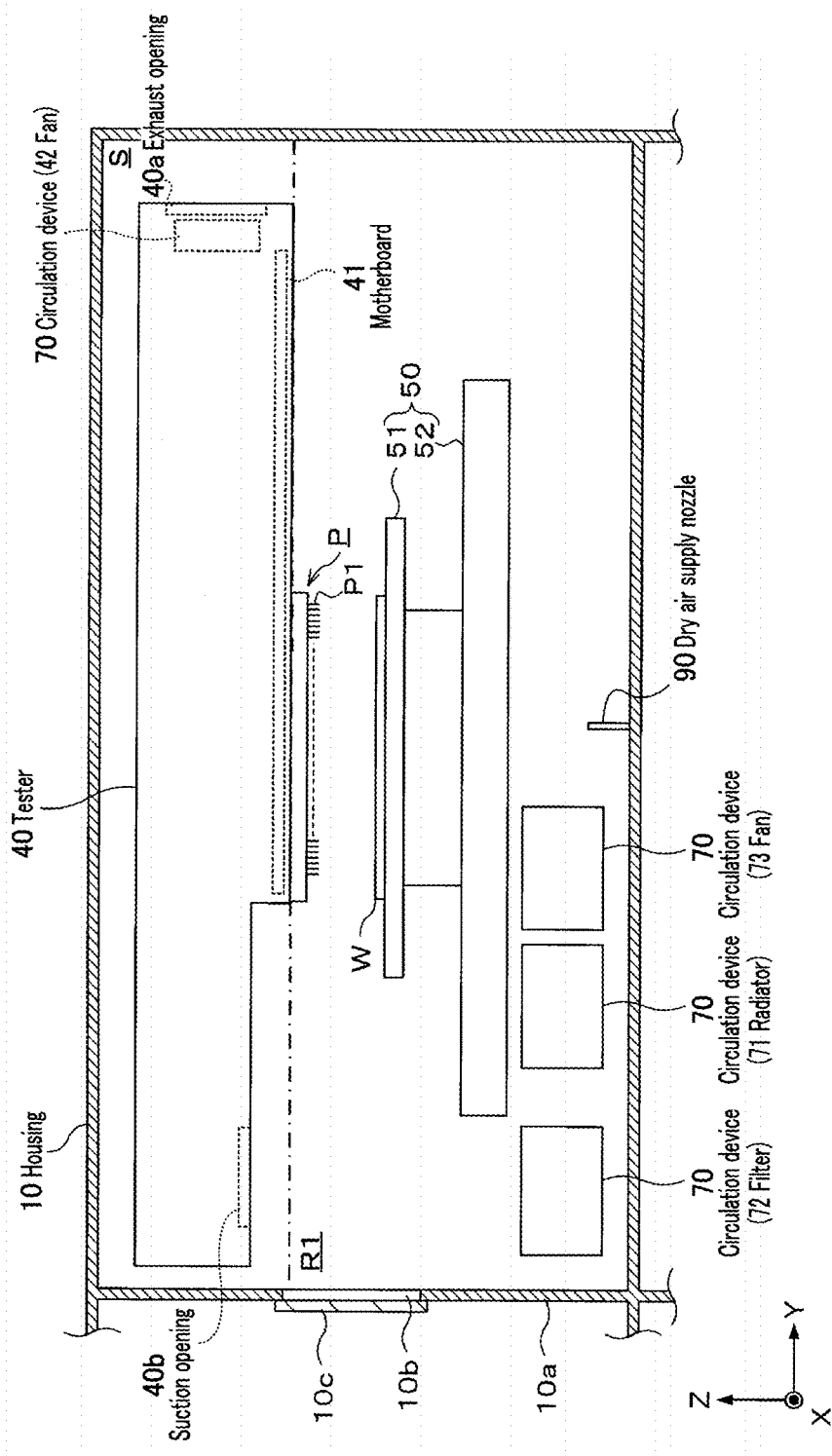
FIG. 5 is a longitudinal side cross sectional view showing an enlargement of a schematic configuration of an inspection apparatus according to a third exemplary embodiment.

FIG. 5 is a longitudinal side cross sectional view illustrating an enlargement of a schematic configuration of an inspection apparatus according to a third exemplary embodiment.

An inspection apparatus 1 according to the third exemplary embodiment includes a dry air supply nozzle 90 as a drying air supply configured to supply dry air configured to reduce a dew point of the air within the inspection space S in addition to the components of the inspection apparatus 1 of the first exemplary embodiment. The dry air supply nozzle 90 is connected to a non-illustrated dry air supply source to supply the dry air from the dry air supply source into the inspection space S. The dry air supply nozzle 90 is disposed in, for example, the second region R12 in the present exemplary embodiment. However, the location of the dry air supply nozzle 90 is not limited thereto and may be placed in another region such as the first region R11.

In the inspection apparatus 1 according to the third exemplary embodiment, by supplying the dry air into the inspection space S and circulating the air, the inside of the inspection space S can be maintained at a low temperature (e.g., a dew point temperature equal to or less than −40° C.) in a clean environment.

Further, although only one position adjuster is provided for the testers in the above-described exemplary embodiments, the position adjuster may be provided for each of the testers.

The exemplary embodiments stated above are not intended to be anyway limiting. The above-described exemplary embodiments may be omitted, replaced and modified in various ways without departing from the scope and the spirit of claims.

Further, configurations as described below belong to the scope of the inventive concept of the present disclosure.

(1) An inspection apparatus configured to inspect a target object, comprising:

an inspector configured to perform an inspection of an electrical characteristic upon the target object;

a gas flow source provided within the inspector and configured to generate a gas flow which cools an inside of the inspector;

a position adjuster configured to place the target object thereon and perform a position adjustment between the placed target object and the inspector;

a housing which accommodates the inspector and the position adjuster in a same space; and a circulation device configured to circulate a gas by the gas flow source between the inside of the inspector and a region where the position adjuster is located within the space, the circulation device including a cooler configured to cool the gas being circulated and a foreign substance remover configured to remove a foreign substance from the gas being circulated.

In the configuration of (1), the inspector and the position adjuster are accommodated in the same space. Accordingly, the gas can be circulated between the inside of the inspector and the region where the position adjuster is located within the space by the gas flow source which is provided within the inspector. Since the foreign substance is removed from this circulation gas by the foreign substance remover, the cleanness of the space of the inspection apparatus can be improved. Further, since the gas is circulated as stated above, the circulation duct having the FFU need not be provided at the outside of the space in which the position adjuster is accommodated. Therefore, the apparatus is not scaled up. Furthermore, since the cooler configured to cool the circulation gas is provided, the inside of the inspector can be cooled even with the circulation gas.

(2) The inspection apparatus,
wherein the position adjuster is disposed under the inspector,
the circulation device is configured to allow the gas within the inspector to be exhausted from one end of the inspector, to pass through following regions (A), (B) and (C) and to be sucked into the inspector through the other end of the inspector, and
wherein (A) First region: a region near the one end of the inspector at a lateral outside of the position adjuster
(B) Second region: a region under the position adjuster
(C) Third region: a region opposite from the first region with the position adjuster therebetween.

By the configuration of (2), the target object placed on the position adjuster can be suppressed from being exposed to an environment having a low degree of cleanness.

(3) The inspection apparatus described in (2), further comprising:
another gas flow source configured to generate a gas flow in the second region.

(4) The inspection apparatus described in (2) or (3),
wherein the cooler is provided in the second region.

(5) The inspection apparatus described in any one of (2) to (4),
wherein the foreign substance remover is provided at a boundary between the second region and the third region.

(6) The inspection apparatus described in any one of (2) to (5),
wherein the circulation device has a rectifying plate disposed at a corner of the space of the housing.

(7) The inspection apparatus described in any one of (1) to (6),
wherein the inspector is provided with a suction opening through which the gas is introduced into the inspector and an exhaust opening through which the gas is exhausted from the inspector, and
the cooler is provided near the exhaust opening within the inspector.

(8) The inspection apparatus described in any one of (1) to (7),
wherein the inspector is provided with a suction opening through which the gas is introduced into the inspector and an exhaust opening through which the gas is exhausted from the inspector, and
the foreign substance remover is provided near the exhaust opening within the inspector.

(9) The inspection apparatus described in any one of (1) to (8), further comprising:
a dry air supply configured to supply, into the space of the housing, a dry air configured to reduce a dew point of the gas within the space.

(10) A cleaning method of an inspection apparatus configured to inspect a target object,
wherein the inspection apparatus comprises:
an inspector configured to perform an inspection of an electrical characteristic upon the target object;
a position adjuster configured to place the target object thereon and perform a position adjustment between the placed target object and the inspector;
a gas flow source provided within the inspector and configured to generate a gas which cools an inside of the inspector; and
a housing which accommodates the inspector and the position adjuster in a same space, and
wherein the cleaning method comprises:
circulating the gas by the gas flow source between the inside of the inspector and a region where the position adjuster is located within the space;
cooling the gas being circulated; and
removing a foreign substance from the gas being circulated.

According to the exemplary embodiments, it is possible to increase the cleanness of the inspection apparatus without scaling it up.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. An inspection apparatus configured to inspect a target object, comprising:
   an inspector configured to perform an inspection of an electrical characteristic upon the target object;
   a gas flow source provided within the inspector and configured to generate a gas flow which cools an inside of the inspector;
   a position adjuster configured to place the target object thereon and perform a position adjustment between the placed target object and the inspector;
   a housing which accommodates the inspector and the position adjuster in a same space; and
   a circulation device positioned within the housing and configured to circulate a gas within the housing by the gas flow source between the inside of the inspector and a region where the position adjuster is located within the space, the circulation device including a cooler configured to cool the gas being circulated and a foreign substance remover configured to remove a foreign substance from the gas being circulated.

2. The inspection apparatus of claim 1,
wherein the position adjuster is disposed under the inspector, the circulation device is configured to allow the gas within the inspector to be exhausted from one end of the inspector, to pass through following regions (A), (B) and (C) and to be sucked into the inspector through the other end of the inspector, and wherein (A) First region: a region near the one end of the inspector at a lateral outside of the position adjuster (B) Second region: a region under the position adjuster (C) Third region: a region opposite from the first region with the position adjuster therebetween.

3. The inspection apparatus of claim 2, further comprising:
another gas flow source configured to generate a gas flow in the second region.

4. The inspection apparatus of claim 3,
wherein the cooler is provided in the second region.

5. The inspection apparatus of claim 4,
wherein the foreign substance remover is provided at a boundary between the second region and the third region.

6. The inspection apparatus of claim 5,
wherein the circulation device has a rectifying plate disposed at a corner of the space of the housing.

7. The inspection apparatus of claim 6,
wherein the inspector is provided with a suction opening through which the gas is introduced into the inspector and an exhaust opening through which the gas is exhausted from the inspector, and
the cooler is provided near the exhaust opening within the inspector.

8. The inspection apparatus of claim 7,
wherein the inspector is provided with a suction opening through which the gas is introduced into the inspector and an exhaust opening through which the gas is exhausted from the inspector, and
the foreign substance remover is provided near the exhaust opening within the inspector.

9. The inspection apparatus of claim 8, further comprising:
a dry air supply configured to supply, into the space of the housing, a dry air configured to reduce a dew point of the gas within the space.

10. The inspection apparatus of claim 2,
wherein the cooler is provided in the second region.

11. The inspection apparatus of claim 2,
wherein the foreign substance remover is provided at a boundary between the second region and the third region.

12. The inspection apparatus of claim 2,
wherein the circulation device has a rectifying plate disposed at a corner of the space of the housing.

13. The inspection apparatus of claim 1,
wherein the inspector is provided with a suction opening through which the gas is introduced into the inspector and an exhaust opening through which the gas is exhausted from the inspector, and
the cooler is provided near the exhaust opening within the inspector.

14. The inspection apparatus of claim 1,
wherein the inspector is provided with a suction opening through which the gas is introduced into the inspector and an exhaust opening through which the gas is exhausted from the inspector, and
the foreign substance remover is provided near the exhaust opening within the inspector.

15. The inspection apparatus of claim 1, further comprising:
a dry air supply configured to supply, into the space of the housing, a dry air configured to reduce a dew point of the gas within the space.

16. A cleaning method of an inspection apparatus configured to inspect a target object,
wherein the inspection apparatus comprises:
an inspector configured to perform an inspection of an electrical characteristic upon the target object;
a position adjuster configured to place the target object thereon and perform a position adjustment between the placed target object and the inspector;
a gas flow source provided within the inspector and configured to generate a gas which cools an inside of the inspector;
a housing which accommodates the inspector and the position adjuster in a same space; and
a circulation device positioned within the housing and configured to circulate a gas within the housing by the gas flow source between the inside of the inspector and a region where the position adjuster is located within the space, the circulation device including a cooler configured to cool the gas being circulated and a foreign substance remover configured to remove a foreign substance from the gas being circulated, and
wherein the cleaning method comprises controlling the circulation device to perform:
circulating the gas by the gas flow source between the inside of the inspector and a region where the position adjuster is located within the space;
cooling the gas being circulated; and
removing a foreign substance from the gas being circulated.

* * * * *